(12) United States Patent  
Koizumi et al.

(10) Patent No.: US 7,990,221 B2  
(45) Date of Patent: Aug. 2, 2011

(54) DETECTOR CIRCUIT AND SYSTEM FOR A WIRELESS COMMUNICATION

(75) Inventors: Haruhiko Koizumi, Osaka (JP); Kaname Motoyoshi, Hyogo (JP)

(73) Assignee: Panasonic Corporation, Osaka (JP)

( * ) Notice: Subject to any disclaimer, the term of this patent is extended or adjusted under 35 U.S.C. 154(b) by 8 days.

(21) Appl. No.: 12/512,684

(22) Filed: Jul. 30, 2009

(65) Prior Publication Data

US 2010/0026390 A1 Feb. 4, 2010

(30) Foreign Application Priority Data

Aug. 1, 2008 (JP) ................................ 2008-199982

(51) Int. Cl.  
*H03G 3/10* (2006.01)

(52) U.S. Cl. ...................... 330/285; 330/296

(58) Field of Classification Search .............. 330/285, 330/296, 308; 250/214 A  
See application file for complete search history.

(56) References Cited

U.S. PATENT DOCUMENTS

| | | | |
|---|---|---|---|
| 6,275,687 B1 * | 8/2001 | Lloyd | 455/292 |
| 6,448,855 B1 | 9/2002 | Sowlati et al. | |
| 6,531,925 B2 * | 3/2003 | Scott et al. | 330/308 |
| 6,625,429 B1 | 9/2003 | Yamashita | |
| 7,126,412 B2 * | 10/2006 | Amamiya | 327/538 |
| 7,245,182 B2 | 7/2007 | Koizumi | |
| 7,274,206 B2 | 9/2007 | Prikhodko et al. | |

FOREIGN PATENT DOCUMENTS

| | | |
|---|---|---|
| JP | 2001-016116 | 1/2001 |
| JP | 2003-531547 | 10/2003 |
| JP | 3847756 B2 | 11/2006 |

* cited by examiner

*Primary Examiner* — Henry K Choe

(74) *Attorney, Agent, or Firm* — McDermott Will & Emery LLP

(57) ABSTRACT

Provided are a detector circuit which has a simple circuit configuration, is capable of indicating an accurate power according to a load fluctuation of a radio frequency power amplifier or a difference in a modulation mode, and can be easily incorporated in the radio frequency power amplifier, and a wireless communication system using the detector circuit. The detector circuit 10 includes a detecting resistor 11 for detecting a part of a current flowing from a bias circuit 6, and a current-voltage conversion circuit 12 for converting a current obtained through the detecting resistor 11 into a voltage. A current supplied from the bias circuit 6 to the amplifying transistor 1 is detected, so that an output current from the amplifying transistor 1 fluctuates when a load on the radio frequency power amplifier fluctuates, and an input current and a current from the bias circuit fluctuate in proportion to the output current from the amplifying transistor 1, whereby an outputted detection voltage can follow a load fluctuation on the radio frequency power amplifier.

3 Claims, 12 Drawing Sheets

DETECTOR CIRCUIT AND SYSTEM FOR A WIRELESS COMMUNICATION

BACKGROUND OF THE INVENTION

1. Field of the Invention

The present invention relates to a detector circuit used in a wireless communication system, such as a mobile telephone. More particularly, the present invention relates to detection of an operating current in a radio frequency power amplifier for controlling an output power in a wireless communication system.

2. Description of the Background Art

As for mobile telephones, it is necessary to control an output power of a radio frequency power amplifier according to a signal from a baseband circuit, so that the output power from the radio frequency power amplifier is detected. In general, as disclosed in Japanese Laid-Open Patent Publication No. 2001-16116, the output power is monitored in the detector circuit via a coupled device, such as a coupler, converted to a voltage value and fed back to the control circuit and the like.

The detector circuit has been often formed as a semiconductor integrated circuit independent of the radio frequency power amplifier. However, owing to a demand for reduction of the number of parts in recent years, the detector circuit tends to be integrated in the radio frequency power amplifier.

The detector circuit is classified, into a circuit for power detection, a circuit for voltage detection and a circuit for current detection. A conventional detector circuit will be described with reference to the drawing. FIG. 12 is a diagram illustrating a conventional detector circuit of power detection type disclosed in Japanese Translation of PCT International Publication No. 2003-531547.

As shown in FIG. 12, an input matching circuit 2 is connected to a base of an amplifying transistor 1 and an output matching circuit 3 is connected to a collector of the amplifying transistor 1. An input terminal 4 (Vin) is connected to the input matching circuit 2. The output matching circuit 3 is connected to an output terminal 5 (Vout). A bias circuit 6 for supplying a bias is connected to the base of the amplifying transistor 1. A detecting transistor 7 is connected in parallel with the amplifying transistor 1. A root mean square circuit 8 is connected to a collector of the detecting transistor 7. The detecting transistor 7 and the root mean square circuit 8 form the detector circuit 10. The size of the detecting transistor 7 is smaller than that of the amplifying transistor 1.

Next, an operation of the conventional detector circuit 10 will be described.

A radio frequency signal (RF signal) is inputted to the detecting transistor 7 and the amplifying transistor 1 at the same time.

If an output voltage from the detecting transistor 7 is directly used to a detection signal, an accurate average power cannot be obtained since the output voltage temporally fluctuates. For this reason, a voltage proportional to the square of the output current from the detecting transistor 7 is generated and then the generated voltage is averaged, by connecting the root mean square circuit 8 with an output of the detecting transistor 7. Because the transistors used for the amplifying transistor 1 and the detecting transistor 7 have the same structure, the detection voltage (VDET) obtained at the detector output terminal 9 is proportional to the power level of the amplifying transistor 1, and the power level is proportional to the square mean value of the current of the amplifying transistor 1. Accordingly, the power level can be indicated more accurately.

However, the conventional detector circuit 10 detects the inputting power to the amplifying transistor 1. When the load impedance seen by the radio frequency power amplifier changes due to factors such as the distance between the antenna and the user's body, a correct power level cannot be indicated, because the detector circuit 10 cannot follow the load variation.

In addition to this recent digital wireless communication systems are operated under the various modulation signals like Release 99, HSDPA, HSUPA, and various peak-to-average power ratio signals are used. However, when the peak-to-average power ratio of the modulation signal changes, 1 dB gain compression output power (P1 dB) of the transistor changes. Because the radio frequency power amplifier has multiple-stage transistors, the fluctuation of P1 dB causes a difference in the distortion characteristics in the each stage. As a result, output characteristics fluctuate in accordance with the modulation signal. Accordingly, the correct power cannot be obtained by detecting the input power level of the radio frequency power amplifier.

On the other hand, when an output power level of the amplifying transistor 1 is detected, a coupled device, such as a directional coupler, is used. As a result, a circuit scale is increased and it becomes hard for the detector circuit 10 to be incorporated in the radio frequency power amplifier. In addition, such coupled device causes a loss, which has a worse hand in size and performance.

SUMMARY OF THE INVENTION

An object of the present invention is to provide a detector circuit which has a simple circuit configuration and to provide a wireless communication system using the detector circuit. This is capable of indicating an accurate power level according to a load fluctuation of a radio frequency power amplifier or a difference in peak-to-average power ratio of a modulation wave signal, and can be easily incorporated in the radio frequency power amplifier.

The present invention is directed to a detector circuit used for a power amplifier circuit including an amplifying transistor, and a bias circuit supplying the amplifying transistor with a bias current. In order to attain the above-described object, a first aspect of the present invention is directed to a detector circuit including a resistor, having one end connected to a connecting point at which a bias circuit and a base of an amplifying transistor are connected with each other, for detecting a part of a bias current supplied from the bias circuit, and a current-voltage conversion circuit, connected to the other end of the resistor, for converting a current flowing through the resistor into a voltage. A bipolar transistor or a field effect transistor may be employed as the current-voltage conversion circuit.

In another aspect, a current partition transistor having a collector and a base respectively connected to a collector and a base of an emitter follower transistor of the bias circuit for supplying a base of the amplifying transistor with a bias current is included, and a resistor, having one end connected to an emitter of the current partition transistor, detects a part of the emitter current supplied from the current partition transistor.

The detector circuit can be used for a wireless communication system using a radio frequency power amplifier including a two stage amplifier circuit, the wireless communication system including a driver stage amplifier circuit for amplifying a radio frequency signal, a final stage amplifier circuit for amplifying an output from the driver stage amplifier circuit, a driver stage bias circuit for supplying an input terminal of the driver stage amplifier circuit with a bias current, and a final stage bias circuit for supplying an input terminal of the final stage amplifier circuit with a bias current. The detector circuit is connected to either or both of the driver stage bias circuit and the final stage bias circuit.

Note that a control circuit can be further included, for controlling the bias currents from the driver stage bias circuit and the final stage bias circuit in accordance with a value of a voltage outputted from the detector circuit. Further, in the case where a DC-DC converter for supplying each of an output terminal of the driver stage amplifier circuit and an output terminal of the final stage amplifier circuit with a voltage, is included, the control circuit can control a voltage outputted from the DC-DC converter.

According to the present invention, an advantageous effect can be achieved that an accurate power level can be indicated in accordance with a load fluctuation or a difference in a modulation wave mode, and that the detector circuit can be easily incorporated in the radio frequency power amplifier.

Further, another advantageous effect can be achieved that a power detection range (dynamic range) can be wider by separately providing a transistor at which a current is detected and a transistor for supplying a bias.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
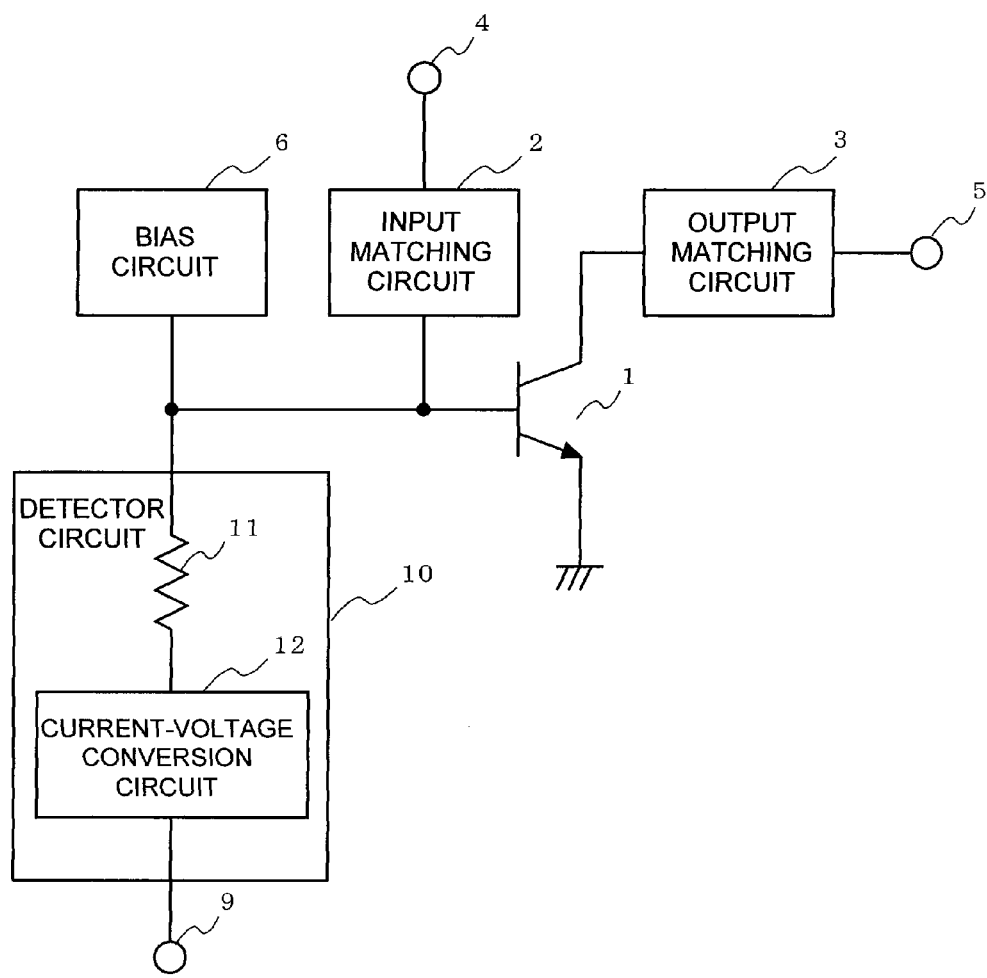
FIG. 1 is a diagram illustrating a schematic configuration of a detector circuit according to a first embodiment of the present invention.

Embodiments of the present invention will be described with reference to the drawings. Note that, with respect to figures for describing the preferred embodiments of the present invention, the same components as those of the conventional detector circuit and components having the same functions as those in the conventional detector circuit are denoted by the same reference numerals as used for the conventional detector circuit and a repeated description thereof will be omitted.

First Embodiment

FIG. 1 is a diagram illustrating a schematic configuration of a detector circuit 10 according to a first embodiment of the present invention. In FIG. 1, one end of an input matching circuit 2, and a bias circuit 6 for supplying an amplifying transistor 1 with a bias are connected to a base of the amplifying transistor 1. One end of an output matching circuit 3 is connected to a collector of the amplifying transistor 1. An input terminal 4 is connected to the other end of the input matching circuit 2, and the other end of the output matching circuit 3 is connected to an output terminal 5.

The detector circuit 10, which is connected to the base of the amplifying transistor 1, includes a detecting resistor 11 and a current-voltage conversion circuit 12. One end of the detecting resistor 11 is connected to a connecting point at which the bias circuit 6 and the base of the amplifying transistor 1 are connected with each other, and the detecting resistor 11 detects a part of a bias current flowing from the bias circuit 6. The current-voltage conversion circuit 12, which is connected to the other end of the detecting resistor 11, transforms to a voltage a part of the bias current flowing through the detecting resistor 11.

An operation of the detector circuit 10 according to the first embodiment of the present invention will be described.

The bias current, which is supplied from the bias circuit 6 to the amplifying transistor 1, is set so as to allow a desired collector current to flow through the amplifying transistor 1. In addition, a radio frequency signal is inputted from the input terminal 4, amplified by the amplifying transistor 1, and then outputted from the output terminal 5. When power of the radio frequency signal inputted from the input terminal 4 increases, a voltage at the base of the amplifying transistor 1 fluctuates greatly. In accordance therewith, a bias current supplied from the bias circuit 6 to the amplifying transistor 1 also fluctuates greatly.

At the same time, a part of the bias current flowing into the detecting resistor 11 of the detector circuit 10 also fluctuates greatly. The current is converted to a voltage by the current-voltage conversion circuit 12. To get a DC voltage, the voltage which appears at a detector output terminal 9 is processed in a smoothing circuit (not shown). As a result, a detection voltage uniquely corresponding to an input power level is defined.

An example of a setting range for the detecting resistor 11 will be described.

A voltage outputted from the current-voltage conversion circuit 12 fluctuates depending on the current flowing into the detector circuit 10. Generally, the output voltage from the detector circuit 10 is connected to an A/D converter of an RF-IC or a baseband IC. Accordingly, the output voltage may be approximately 2.4 V at a maximum due to the limitation of the supply voltage to the ICs. Further, the smaller the bias current is set, the wider the dynamic range can be. For this reason, the detecting resistor 11 has a preferable value of about several kΩ, and the detecting resistor 11 is set from 1 kΩ to 10 kΩ. Accordingly, the detector circuit 10 is configured so as to have high impedance, and exert little influence on the amplifying transistor 1.

Figure 2:
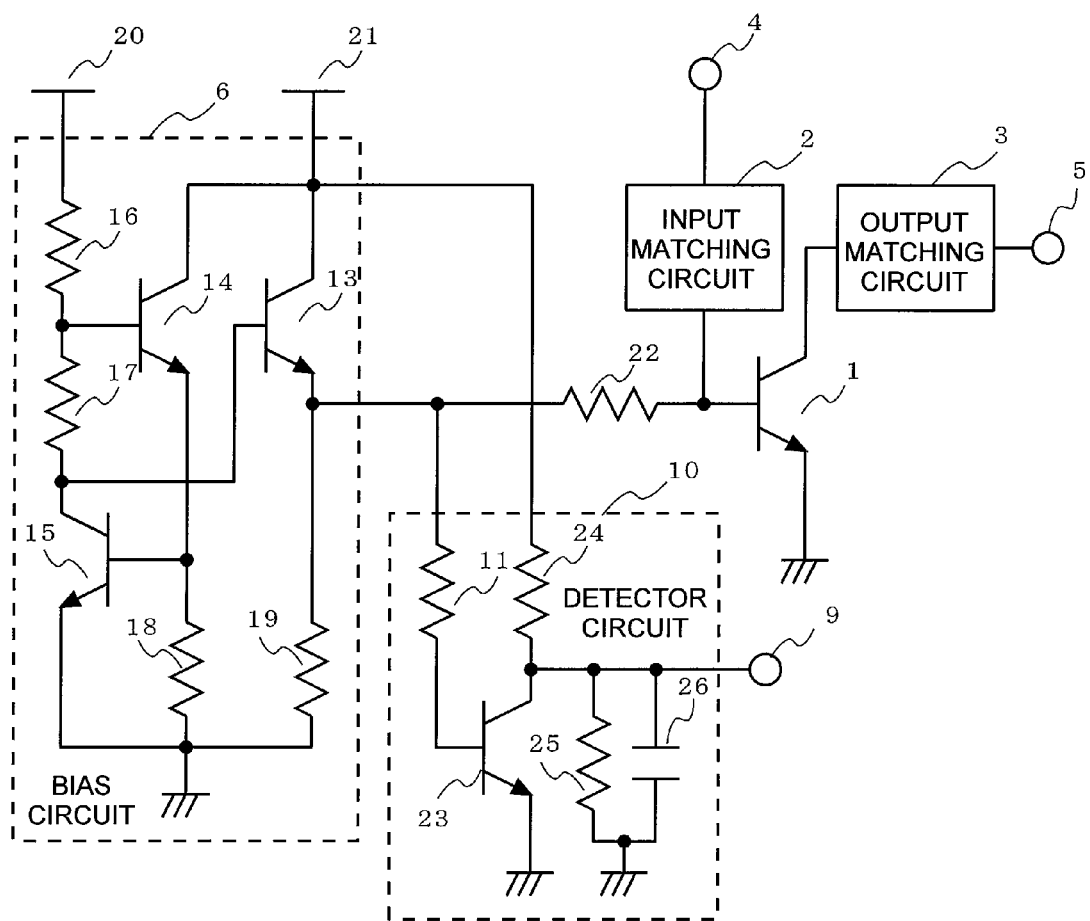
FIG. 2 is a diagram illustrating in detail an example of a detector circuit according to the first embodiment of the present invention.

FIG. 2 is a diagram illustrating in detail an example of a detector circuit 10 according to the first embodiment of the present invention where a bipolar transistor is employed for the current-voltage conversion circuit 12. In FIG. 2, an example of the bias circuit 6 is also illustrated in detail, which is disclosed in Japanese Patent No. 3847756.

The bias circuit 6 includes bipolar transistors 13-15, resistors 16-19, and power source terminals 20 and 21. An emitter of the bipolar transistor 13 is connected to a base of the amplifying transistor 1 via a resistor 22. The resistor 22 is a resistor for circuit stability. An operation of the bias circuit 6 is disclosed in Japanese Patent No. 3847756 and a description thereof will be omitted.

The detector circuit 10 shown in FIG. 2 employs a bipolar transistor 23 as the current-voltage conversion circuit 12. An emitter of the bipolar transistor 23 is connected to a ground. A base of the bipolar transistor 23 is connected to the emitter of the bipolar transistor 13 in the bias circuit 6 via a detecting resistor 11. A collector of the bipolar transistor 23 is connected to the power source terminal 21 of the bias circuit 6 via a resistor 24, and also connected to the detector output terminal 9. A smoothing circuit, composed of a resistor 25 and a capacitor 26, is connected with the detector output terminal 9 in order to detect only DC components in the detection voltage.

Figure 3:
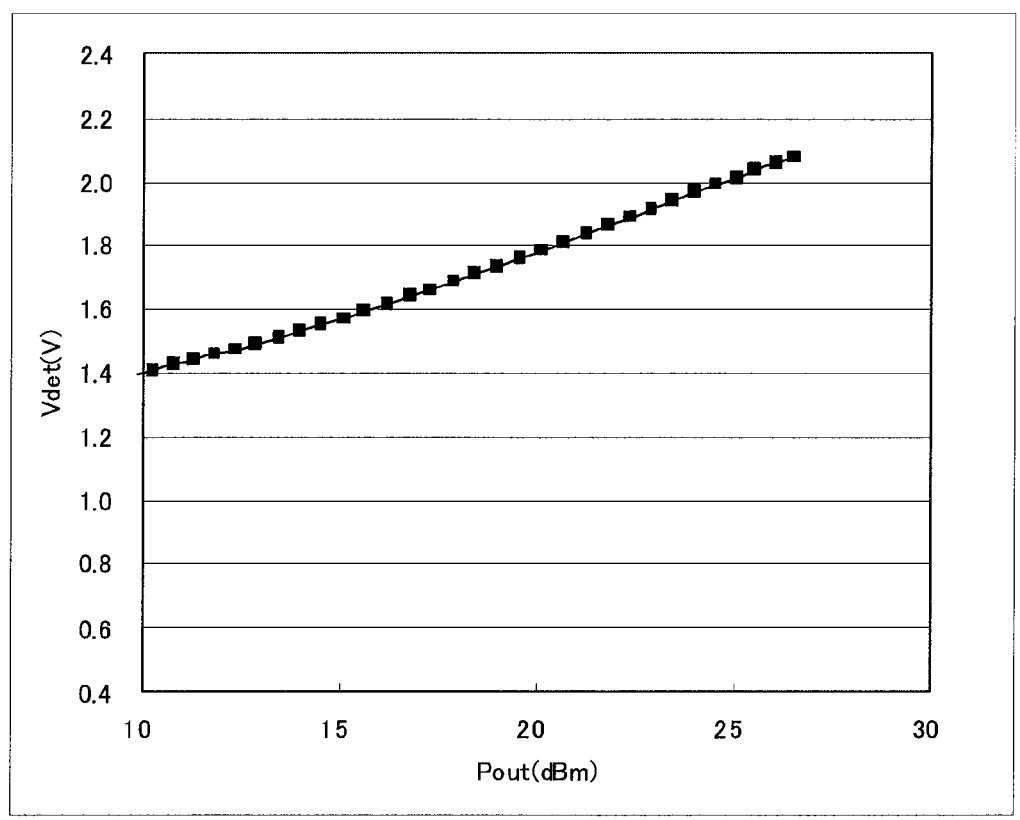
FIG. 3 is a diagram illustrating relationship between an output power level and a detection voltage in an amplifying transistor of the first embodiment of the present invention.

FIG. 3 is a diagram illustrating relationship between an output power level of the amplifying transistor 1 and the detection voltage according to the first embodiment. This result is measured under the condition that the frequency of an RF signal inputted to the amplifying transistor 1 is 2 GHz and the source voltage is 3.5 V. From the drawing, positive correlationship between the output power level and the detection voltage can be seen.

Figure 4:
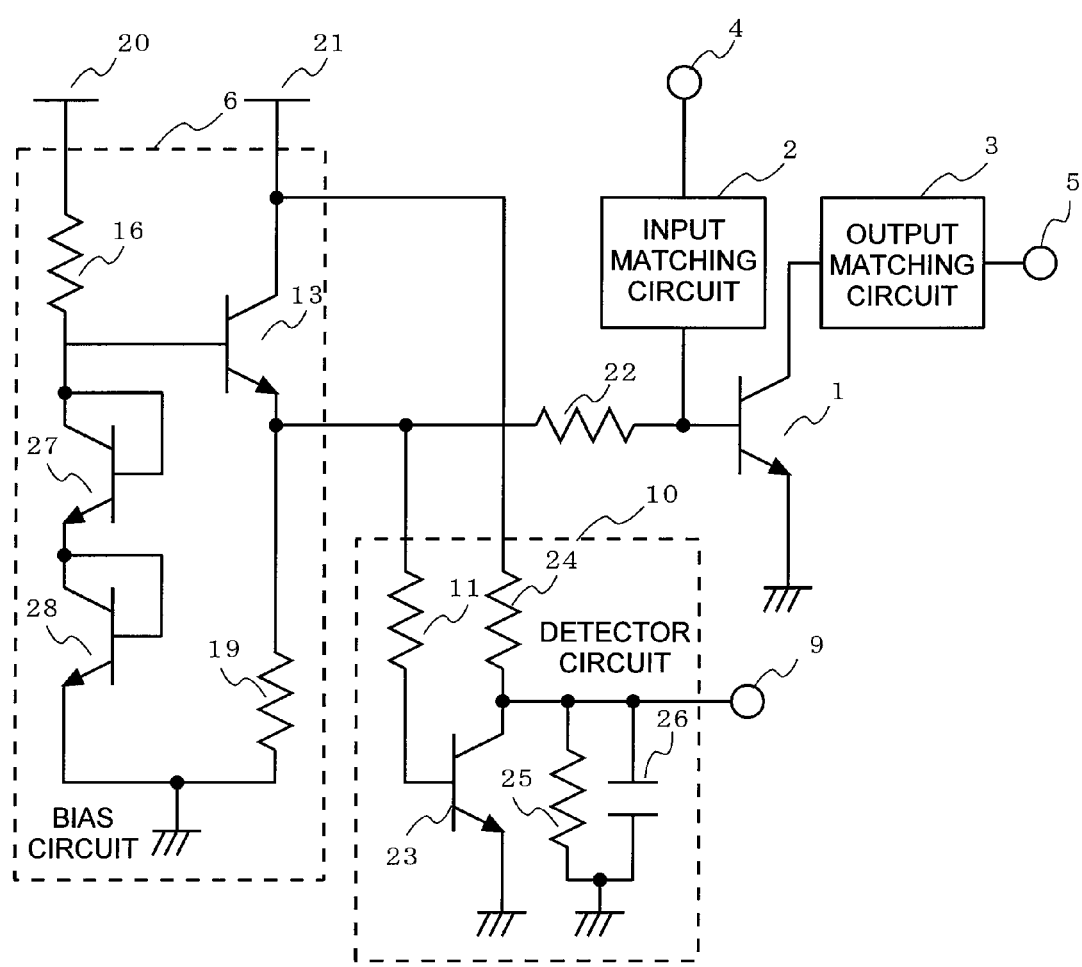
FIG. 4 is a diagram illustrating in detail another example of a detector circuit according to the first embodiment of the present invention.

FIG. 4 shows an example of another bias circuit. The bias circuit 6 comprises series-connected bipolar transistor 27 and 28, which is connected to the base of the bipolar transistor 13. Especially, when superior receiver band noise characteristic is required for the radio frequency power amplifier, or when an operation at higher output power is required for the radio frequency power amplifier, the bias circuit 6 shown in FIG. 4 is preferably employed.

Figure 5:
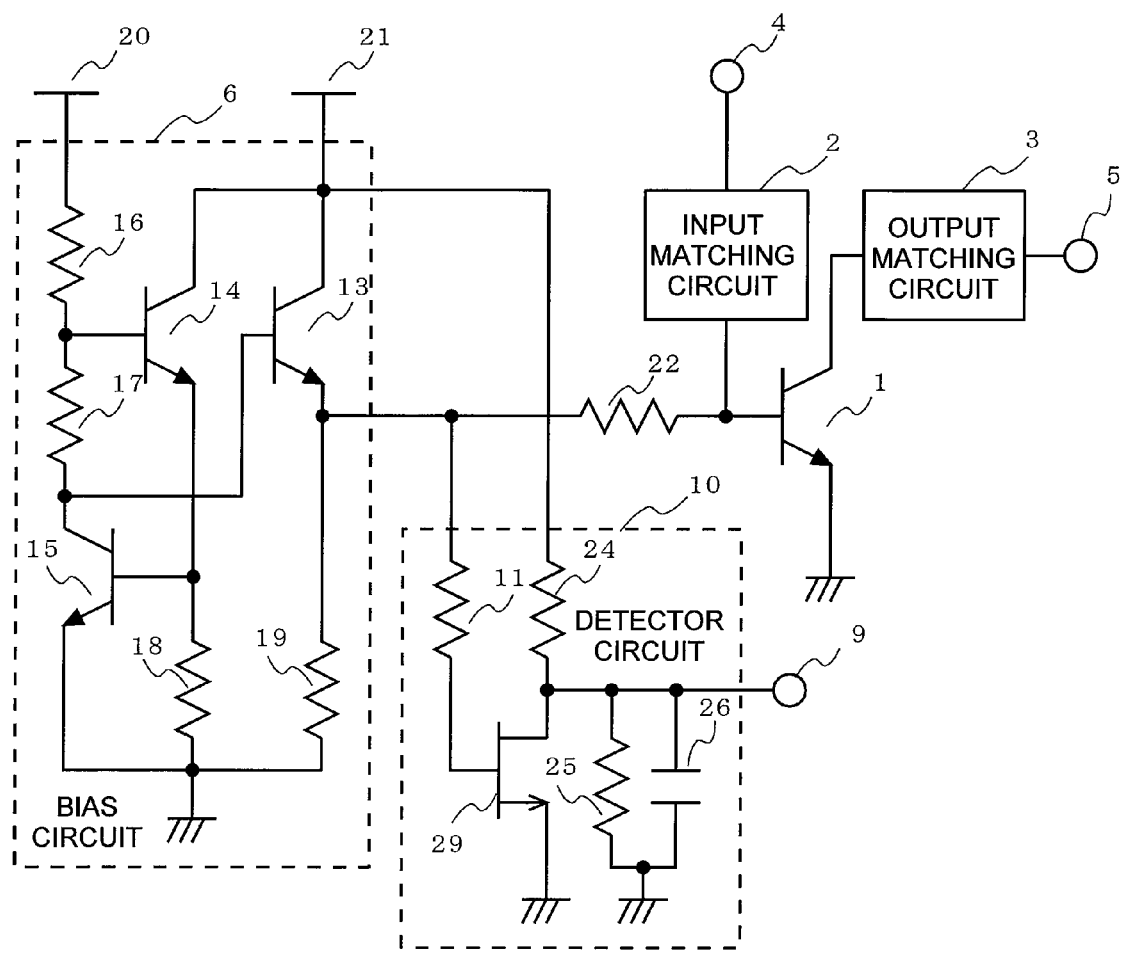
FIG. 5 is a diagram illustrating in detail another example of a detector circuit according to the first embodiment of the present invention.

FIG. 5 illustrates an example of another detector circuit. A field effect transistor 29 is employed for the current-voltage conversion circuit 12 in the detector circuit 10 instead of the bipolar transistor 23. As the field effect transistor approximately shows square-low current-voltage characteristics in a saturation region, the field effect transistor 29 may be employed when relationship between input power and the detection voltage is designed to represent a square-law curve.

Second Embodiment

Figure 6:
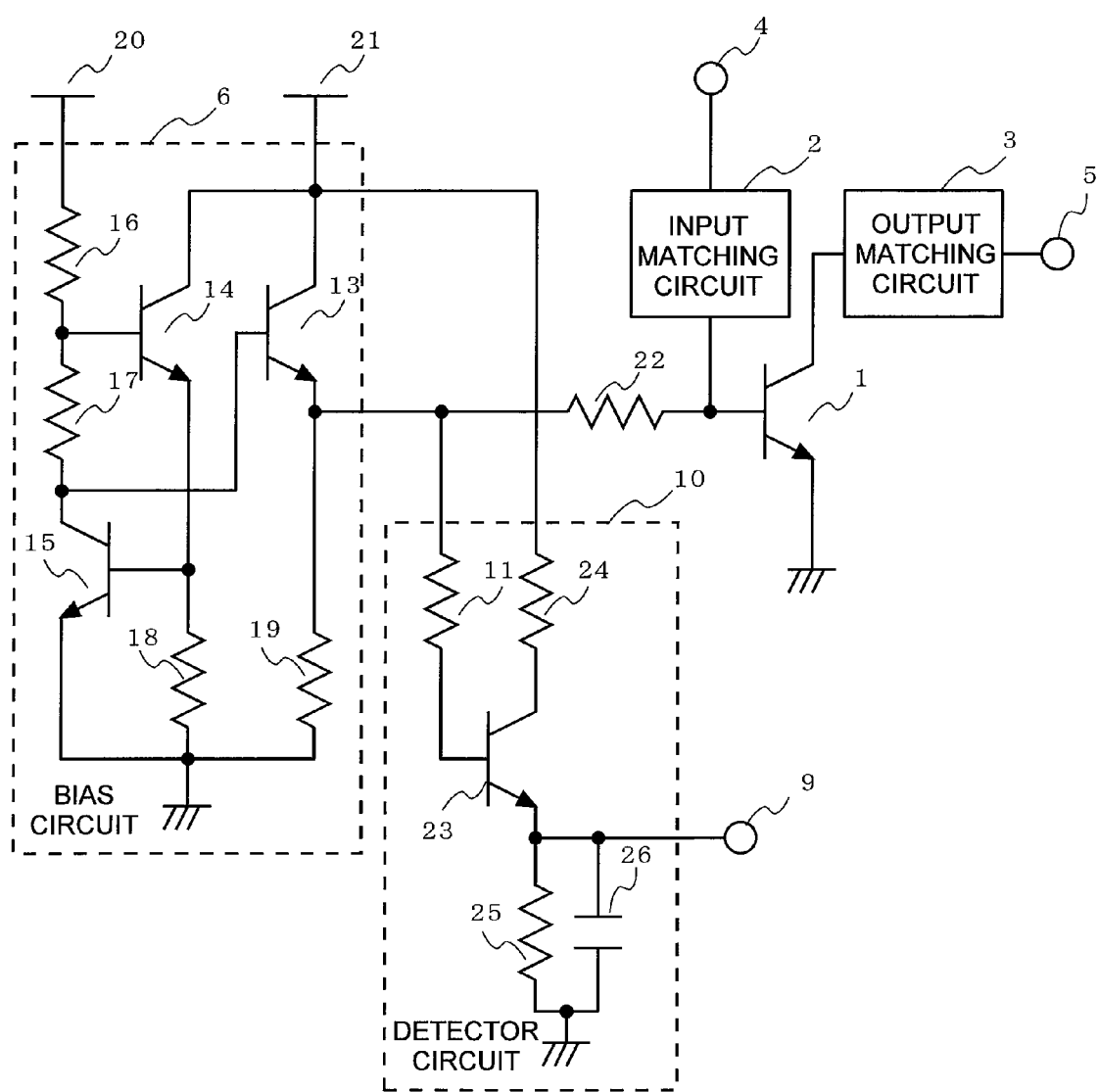
FIG. 6 is a diagram illustrating in detail an example of a detector circuit according to a second embodiment of the present invention.

FIG. 6 is a diagram illustrating in detail an example of a detector circuit 10 according to a second embodiment of the present invention. The detector circuit 10 of the second embodiment is different from the detector circuit 10 of the first embodiment as shown in FIG. 2 in that a portion, at which a voltage is detected, of the bipolar transistor 23, is replaced with the emitter instead of the collector. Operations of other components are basically the same as described for the first embodiment and a detailed description thereof will be omitted.

In the second embodiment, the bipolar transistor 23 is an emitter follower. As the bipolar transistor 23 has low power gain, high input impedance and low output impedance, it serves as an impedance-converter or buffer amplifier. For this reason, the detector circuit 10 according to the second embodiment is preferably used when a detection voltage is designed to be suppressed or when an influence of impedance fluctuation of the bias circuit 6 on the detecting output terminal 9 is desired to be reduced. Note that, as described in the first embodiment, the field effect transistor 29 may be employed instead of the bipolar transistor 23 as the current-voltage conversion circuit 12.

Third Embodiment

Figure 7:
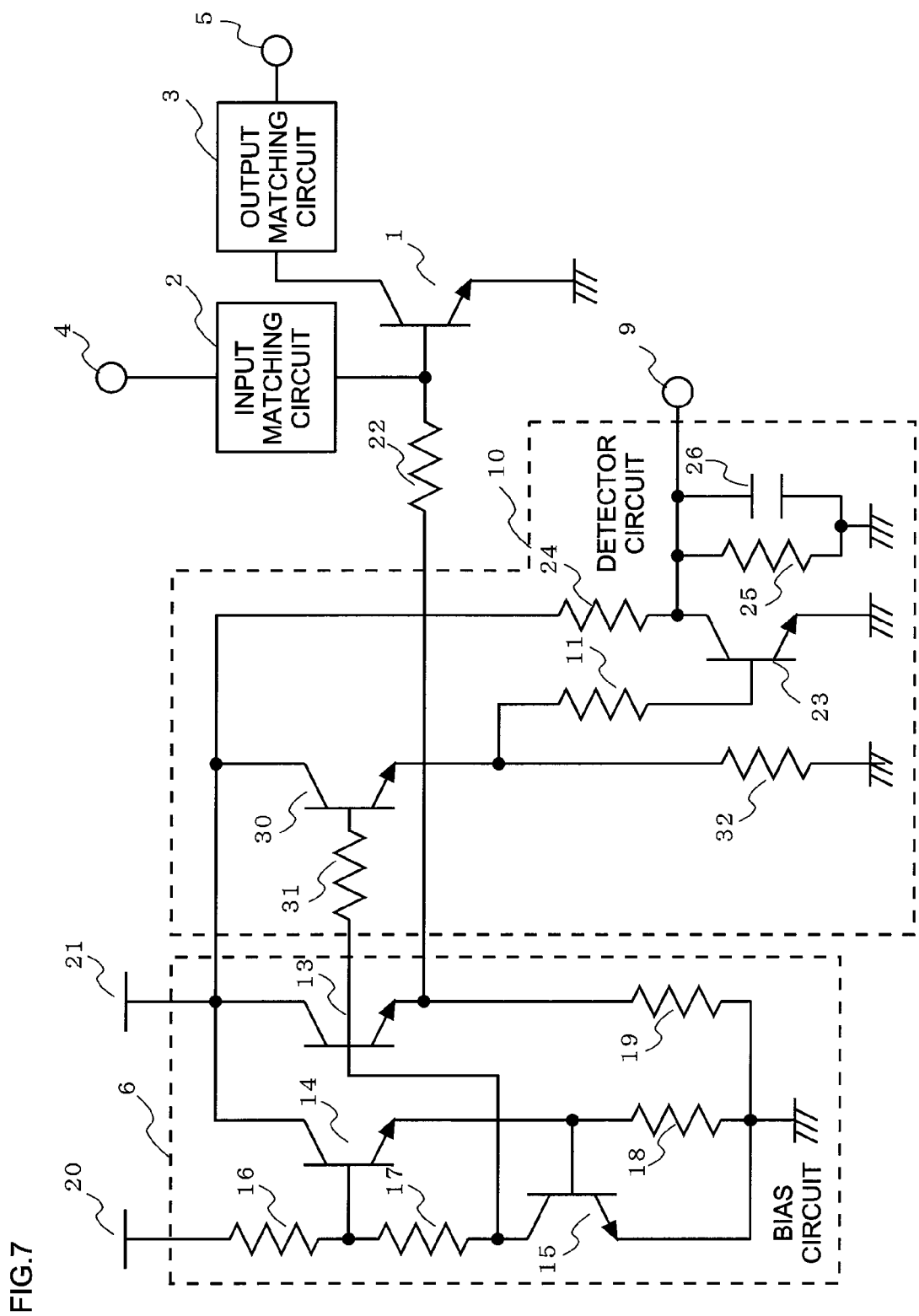
FIG. 7 is a diagram illustrating in detail an example of a detector circuit according to a third embodiment of the present invention.

FIG. 7 is a diagram illustrating in detail an example of a detector circuit 10 according to a third embodiment of the present invention. The detector circuit 10 of the third embodiment is different from the detector circuit 10 of the first embodiment as shown in FIG. 2 in that the detector circuit 10 of the third embodiment additionally has resistors 31 and 32, and a current partition transistor 30, and is connected to an emitter of the current partition transistor 30. Operations of other components are basically the same as described for the first embodiment and a detailed description thereof will be omitted.

A base of the current partition transistor 30 is connected to a base of the bipolar transistor 13 via the resistor 31. A collector of the current partition transistor 30 is connected to a collector of the bipolar transistor 13. The emitter of the current partition transistor 30 is grounded via the resistor 32, and connected to a base of a bipolar transistor 23 via the detecting resistor 11.

In the third embodiment, a current detected by the detector circuit 10 is not same as the current of the bipolar transistor 13 which supplies the amplifying transistor 1 with a bias current. As described above, when a transistor connected to the detecting resistor 11 of the detector circuit 10 is separated from a transistor for supplying a bias, an effect on the bias circuit 6 (e.g., loss and stability) exerted by the detector circuit 10 is reduced. In addition, the value of the detection current can be set independently of a bias current to the amplifying transistor 1. Therefore, a power detection range can be wider.

An example of a setting range of each of the resistors 31 and 32 will be described.

The resistor 31 is preferably set so as to range from a few tens of ohms to a few hundreds of ohms in order to prevent the effect of the voltage rising on the base of the bipolar transistor 13 caused by a radio frequency signal. However, in some cases, for example, where the base of the bipolar transistor 13 is grounded via a capacitor (not shown), the resistor 31 may be set at zero ohm. The resistor 32 is set at approximately 1 kΩ at a minimum, and set at approximately 10 kΩ at a maximum in order to reduce the collector current of the current partition transistor 30.

In the third embodiment, an exemplary configuration where resistors 31 and 32, and the current partition transistor 30 are arranged in addition to the configuration shown in FIG. 2 is described. However, the similar effects can be also provided in the cases where the resistors 31 and 32, and the current partition transistor 30 are arranged in addition to each of the configurations shown in FIGS. 4 through 6.

(An Example of Configuration of a Wireless Communication System where the Detector Circuit of the Present Invention is Used)

FIGS. 8 through 11 are diagrams each illustrating an exemplary configuration of a wireless communication system using the detector circuit 10 according to any one of the first through third embodiments of the present invention.

Figure 8:
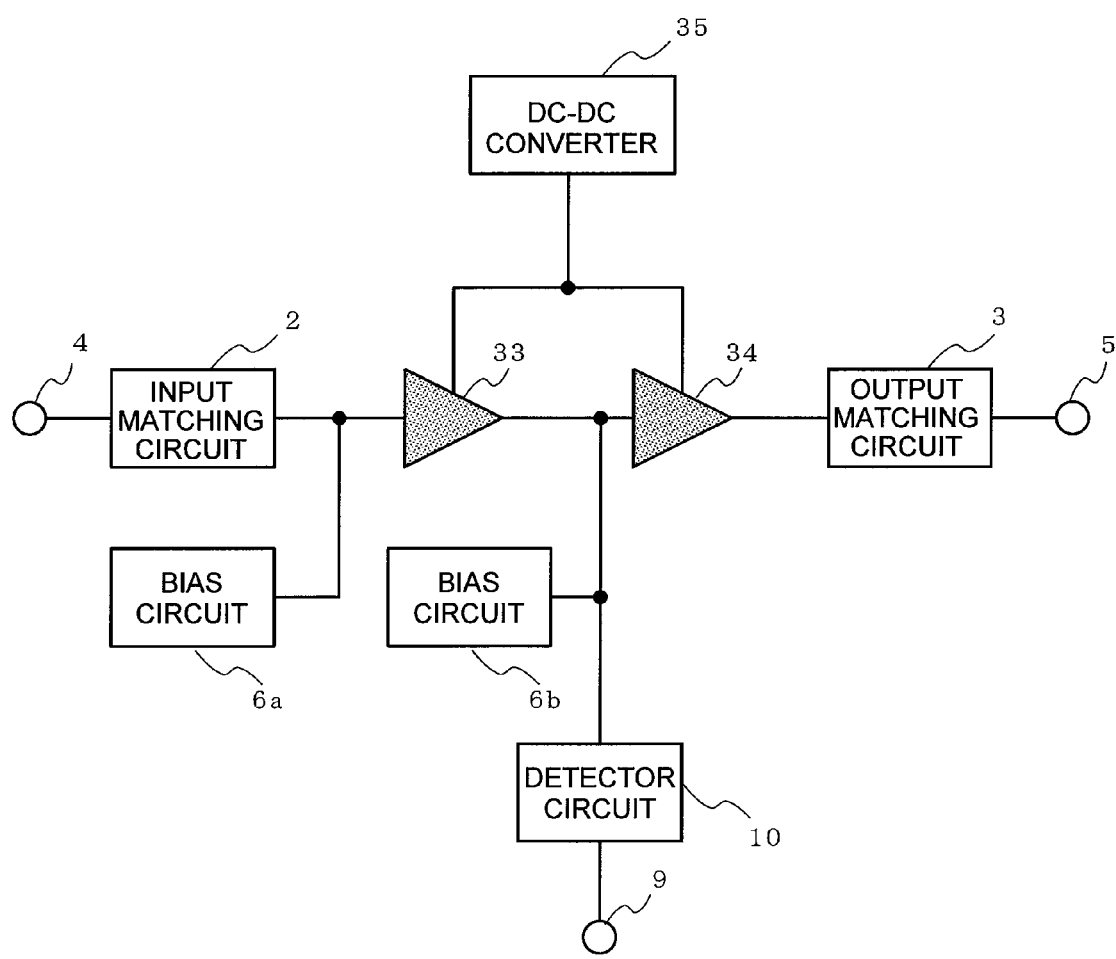
FIG. 8 is a diagram illustrating a schematic configuration of a wireless communication system using the detector circuit of the present invention.

In FIG. 8, a radio frequency power amplifier is realized by a two-stage amplifier including a driver stage amplification circuit 33 and a final stage amplification circuit 34. The input matching circuit 2 is connected to an input of the driver stage amplification circuit 33. The output matching circuit 3 is connected to an output of the final stage amplification circuit 34. A driver stage bias circuit 6a is connected to the driver stage amplification circuit 33, and a final stage bias circuit 6b is connected to the final stage amplification circuit 34, respectively. The detector circuit 10 is connected to the final stage bias circuit 6b. A DC-DC converter 35 is connected to both the driver stage amplification circuit 33 and the final stage amplification circuit 34, such that a voltage obtained by decreasing or increasing a voltage from a battery (not shown) is supplied to both the driver stage amplification circuit 33 and the final stage amplification circuit 34.

Figure 9:
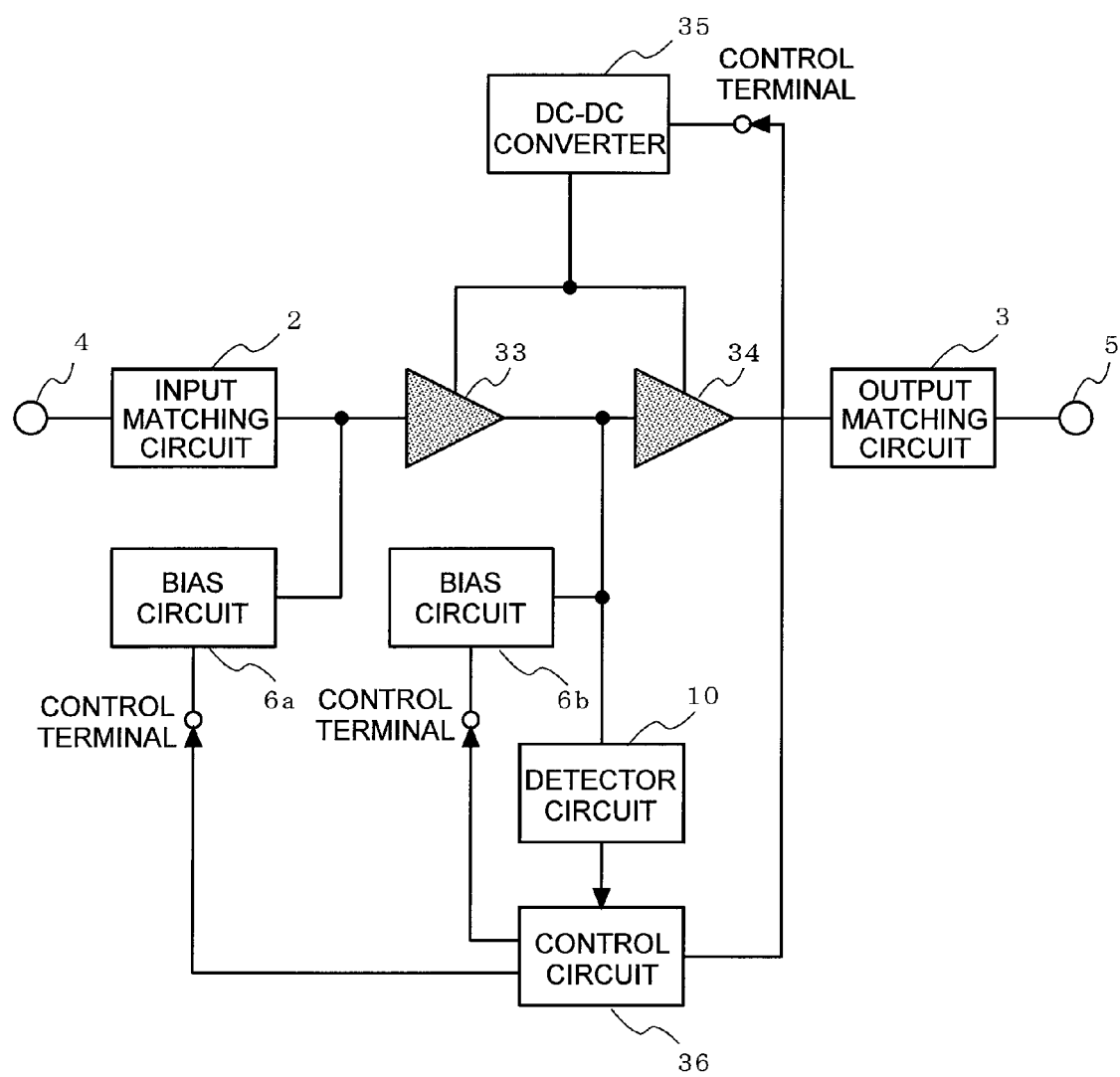
FIG. 9 is a diagram illustrating another schematic configuration of a wireless communication system using the detector circuit of the present invention.

FIG. 9 is a diagram illustrating a configuration where a control circuit 36 is arranged in addition to the configuration of the radio frequency power amplifier shown in FIG. 8 for directly controlling output power by reading the detection voltage. An output voltage from the detector circuit 10, which is connected to the final stage bias circuit 6b, is applied to the control circuit 36. Outputs of the control circuit 36 are connected to control terminals of the driver stage bias circuit 6a, the final stage bias circuit 6b, and the DC-DC converter 35, respectively. In the control circuit 36, necessary calculation is performed depending on the purpose.

Specifically, the control circuit 36 performs feedback processing such that when the detection voltage is higher, a supply voltage to each of the bias circuits 6a and 6b or an output voltage from the DC-DC converter 35 is decreased in order to keep the output power from the radio frequency power amplifier constant.

Alternatively, by storing relationship between an output power level and a detection voltage in a memory previously, such as a look-up table (LUT), a supply voltage to each of the bias circuits 6a and 6b or an output voltage from the DC-DC converter 35 is controlled to obtain a desired output power level, that is, the detection voltage.

Figure 10:
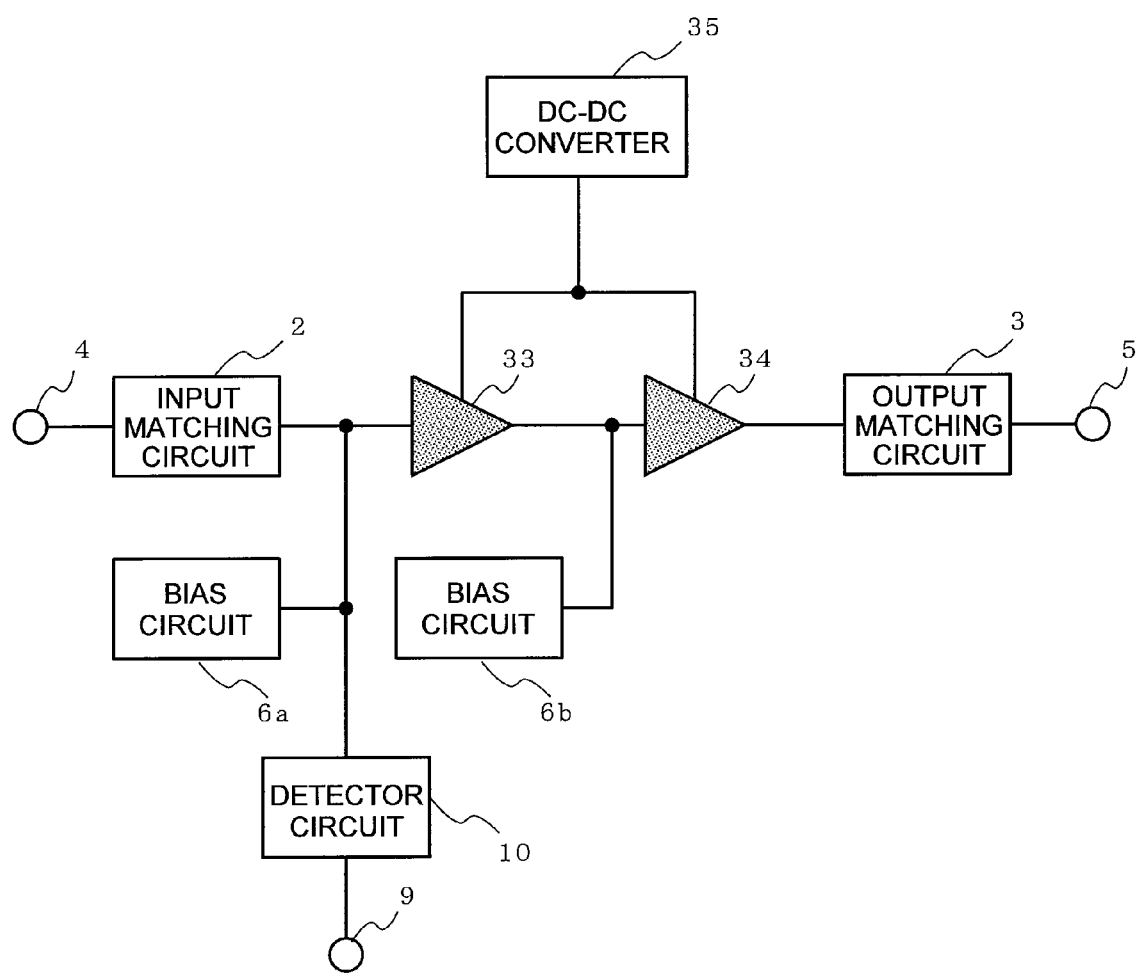
FIG. 10 is a diagram illustrating another schematic configuration of a wireless communication system using the detector circuit of the present invention.

In FIG. 9, an example where the detector circuit 10 is connected to the final stage bias circuit 6b is shown. However, the detector circuit 10 may be connected to the driver stage bias circuit 6a as shown in FIG. 10. Note that the latter configuration is only applicable to the case where the input power to the driver stage amplification circuit 33 is high (e.g., 10 dBm or above) or a voltage detected by an A/D converter in an RF-IC or a baseband IC is relatively-precise.

Figure 11:
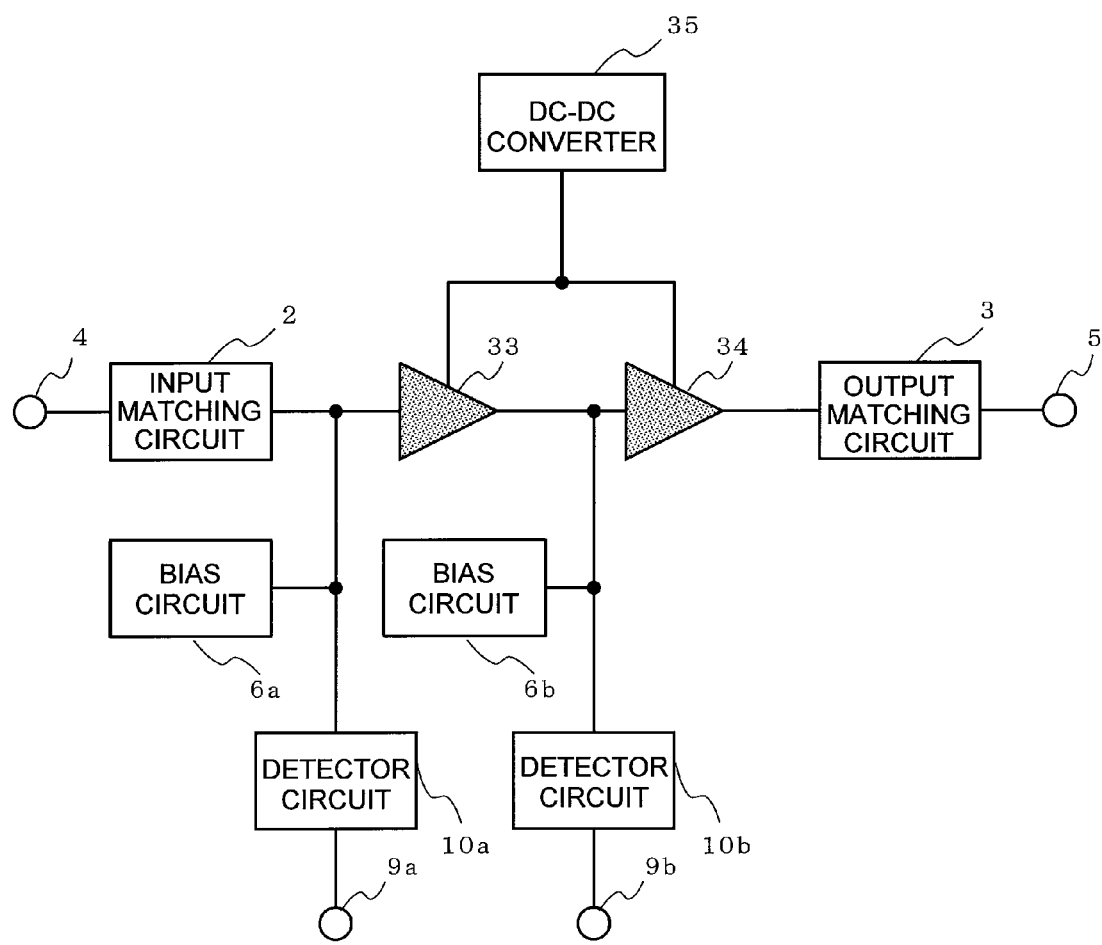
FIG. 11 is a diagram illustrating another schematic configuration of a wireless communication system using the detector circuit of the present invention.
Figure 12:
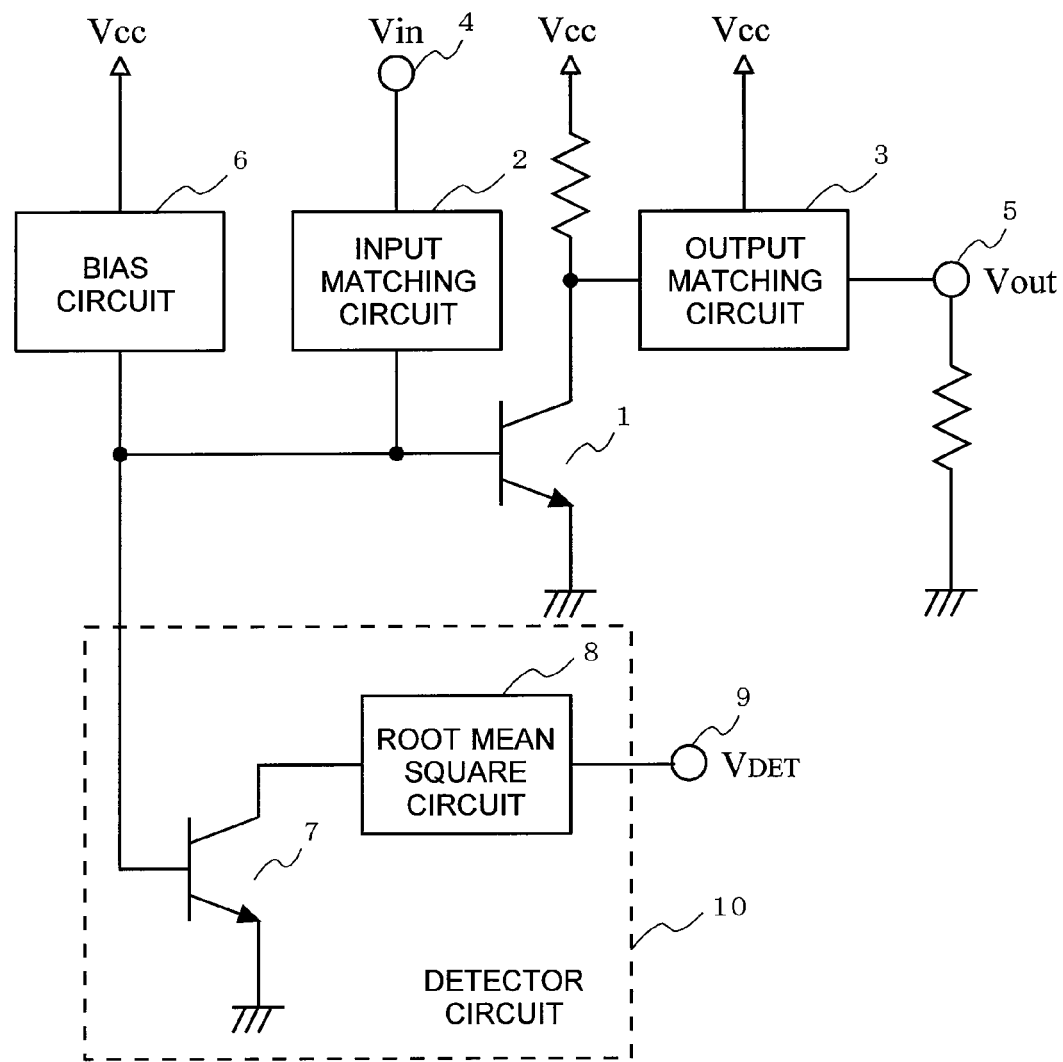
FIG. 12 is a diagram illustrating a schematic configuration of a conventional detector circuit.

Further, detector circuits 10a and 10b may be connected to the driver stage bias circuit 6a and the final stage bias circuit 6b, respectively, as shown in FIG. 11. This configuration is effective in the case where, for example, concurrent operations of the driver stage amplification circuit 33 and the final stage amplification circuit 34 are inhibited, by alternatively switching on and off the driver stage bias circuit 6a and the final stage bias circuit 6b.

While the invention has been described in detail, the foregoing description is in all aspects illustrative and not restrictive. It is understood that numerous other modifications and variations can be devised without departing from the scope of the invention.

What is claimed is:

1. A detector circuit used for a radio frequency power amplifier circuit including an amplifying transistor and a bias circuit supplying a base terminal of the amplifying transistor with a bias current, the detector circuit being connected to a control circuit for controlling an amplification factor of the radio frequency power amplifier, the detector circuit comprising:
    a resistor, having one end connected to a connecting point between the bias circuit and a base terminal of the amplifying transistor, for detecting a part of the bias current supplied from the bias circuit to the amplifying transistor; and
    a current-voltage conversion circuit, connected to the other end of the resistor, for converting the part of the bias current detected by the resistor into a voltage, and supplying the control circuit with the converted voltage as an output voltage, thereby causing the control circuit to perform predetermined control.

2. The detector circuit according to claim 1, wherein a bipolar transistor is employed as the current-voltage conversion circuit.

3. The detector circuit according to claim 1, wherein a field effect transistor is employed as the current-voltage conversion circuit.

* * * * *